United States Patent
Ding et al.

(10) Patent No.: US 7,205,846 B1
(45) Date of Patent: Apr. 17, 2007

(54) RADIO FREQUENCY CMOS AMPLIFIER WITH ENHANCED LINEARITY AND POWER EFFICIENCY

(75) Inventors: Yongwang Ding, Austin, TX (US); Ramesh Harjani, Minneapolis, MN (US)

(73) Assignee: DSP Group Inc., Santa Clara, CA (US)

( * ) Notice: Subject to any disclaimer, the term of this patent is extended or adjusted under 35 U.S.C. 154(b) by 110 days.

(21) Appl. No.: 10/918,745

(22) Filed: Aug. 13, 2004

Related U.S. Application Data

(60) Provisional application No. 60/495,423, filed on Aug. 15, 2003.

(51) Int. Cl.
*H03F 3/04* (2006.01)
(52) U.S. Cl. .................................. 330/311; 330/295
(58) Field of Classification Search ............ 330/124 R, 330/295, 311, 310, 98, 150
See application file for complete search history.

(56) References Cited

U.S. PATENT DOCUMENTS 6,329,877 B1 * 12/2001 Bowen et al. .......... 330/124 R
7,046,746 B1 * 5/2006 Keaney et al. .............. 375/341

FOREIGN PATENT DOCUMENTS

JP        022228807      *  9/1990

* cited by examiner

*Primary Examiner*—Henry Choe
(74) *Attorney, Agent, or Firm*—Shumaker & Sieffert P.A.

(57) ABSTRACT

In general, the disclosure is directed to techniques for enhancing power efficiency and linearity in an RF power amplifier. In accordance with the invention, a combination of different class power amplifiers is implemented in a parallel configuration to overcome the trade-off that exists between power efficiency and linearity. In particular, a class A amplifier and a class B amplifier are arranged in parallel to produce a combined amplifier output for an input signal. With bias voltages set to achieve a desired operating ratio between the class A and class B amplifier, the combined amplifier can provide a high power gain over a larger input range. In addition, the class B amplifier can provide increased power efficiency for larger inputs.

34 Claims, 8 Drawing Sheets

RADIO FREQUENCY CMOS AMPLIFIER WITH ENHANCED LINEARITY AND POWER EFFICIENCY

This application claims the benefit of U.S. Provisional Application Ser. No. 60/495,423, filed Aug. 15, 2003, the entire content of which is incorporated herein by reference.

TECHNICAL FIELD

The invention relates to wireless communication and, more particularly, to power amplifiers for amplifying wireless signals.

BACKGROUND

Wireless communication involves transmission of encoded information on a modulated radio frequency (RF) carrier signal. A wireless transceiver includes a power amplifier to amplify a modulated signal to levels sufficient for driving the transmitting antenna. Some wireless communication systems, such as those conforming to the 802.11a standard, can require a high dynamic range for the up-converter and a large power back-off for the power amplifier due to the high peak-to-average power ratios (PAPR) encountered. When high PAPR signals are transmitted through non-linear power amplifiers, the signal will be severely distorted. The high dynamic range requirement and the large power back-off also result in large direct current (dc) power consumption for the transmitter.

Chip producers generally prefer CMOS technology in highly integrated wireless devices because it facilitates fabrication of high-volume, high-complexity, and compatible digital circuitry at low cost. However, CMOS has not typically been a good selection for designers because of its lower performance in terms of linearity and power efficiency. Several classes of CMOS power amplifiers exist, with classes A, AB, and B being most commonly used in wireless communication systems. The three classes of power amplifiers are distinguished by bias conditions, with each class exhibiting unique power gain and efficiency characteristics.

Power gain is defined as the output power divided by the input power, and power efficiency is typically measured as power added efficiency (PAE) defined as the quantity of input power subtracted from the output power, and divided by the DC power consumption. A trade-off exists, particularly in CMOS technology, between power efficiency and linearity. Class A power amplifiers are biased to stay in the saturation region of operation, exhibiting a high linear power gain at low power inputs and low PAE, especially at low power inputs. Class B power amplifiers are biased to shut off the output of a device during approximately half of every cycle. Class AB power amplifiers are biased to shut off the output of the device between 0% and 50% of every cycle. This results in a higher PAE for class B power amplifiers but a lower and more distorted power gain at low power inputs. Class AB power amplifiers have a PAE and power gain linearity that are intermediate between those of class A and class B power amplifiers.

SUMMARY

In general, the invention is directed to techniques for enhancing power efficiency and linearity in an RF power amplifier. An RF power amplifier with enhanced power efficiency and linearity, as described herein, may be useful in communication systems, such as a wireless communication system. In accordance with the invention, a combination of different class power amplifiers is implemented in a parallel configuration to overcome the trade-off that exists between power efficiency and linearity.

In particular, a class A amplifier and a class B amplifier are arranged in parallel to produce a combined amplifier output for an input signal. With bias voltages set to achieve a desired operating ratio between the class A and class B amplifier, the combined amplifier can provide a high power gain over a larger input range. The bias voltages may be set, for example, such that the power gain is dominated by the class A amplifier at small input powers and dominated by the class B amplifier at larger input powers.

The class B amplifier can contribute a higher one decibel compression point (P1 dB point) for the linear portion of the gain curve at larger inputs. In addition, the class B amplifier can provide increased power efficiency for larger inputs. In this manner, the parallel configuration of the class A and class B amplifiers overcomes the trade-off that exists between power efficiency and linearity, thus providing an amplifier circuit with enhanced power efficiency and linearity.

The combined class A/class B amplifier configuration may be used in any wireless communication system, but may be especially effective in systems that demand increased dynamic ranges, such as systems that implement orthogonal frequency division multiplexing (OFDM) techniques.

In one embodiment, the invention is directed to an amplifier circuit comprising a class A power amplifier, and a class B power amplifier coupled to the class A power amplifier such that the class A and class B power amplifiers produce a combined amplifier output for an input signal.

In another embodiment, the invention is directed to a method comprising amplifying an input signal with the combined outputs of a class A power amplifier and a class B power amplifier.

In a further embodiment, the invention is directed to a wireless device comprising a medium access control (MAC) unit that interacts with a host device to coordinate access to a radio frequency (RF) channel for a signal generated by the host device. The wireless device further includes a transmit power amplifier circuit to amplify the signal and a transmit antenna to transmit the amplified signal to a wireless network. The transmit power amplifier circuit comprises a class A power amplifier and a class B power amplifier coupled to the class A power amplifier such that the class A and class B power amplifiers produce a combined amplifier output for an input signal.

The invention may provide one or more advantages. For example, the invention may provide an RF CMOS power amplifier with a high linear power gain over a larger input range. The invention may also have high power efficiency over a larger input range. The enhanced performance of the invention may allow systems that demand increased dynamic ranges, such as OFDM systems, to function over larger distances and for longer periods of time for a given power capability.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
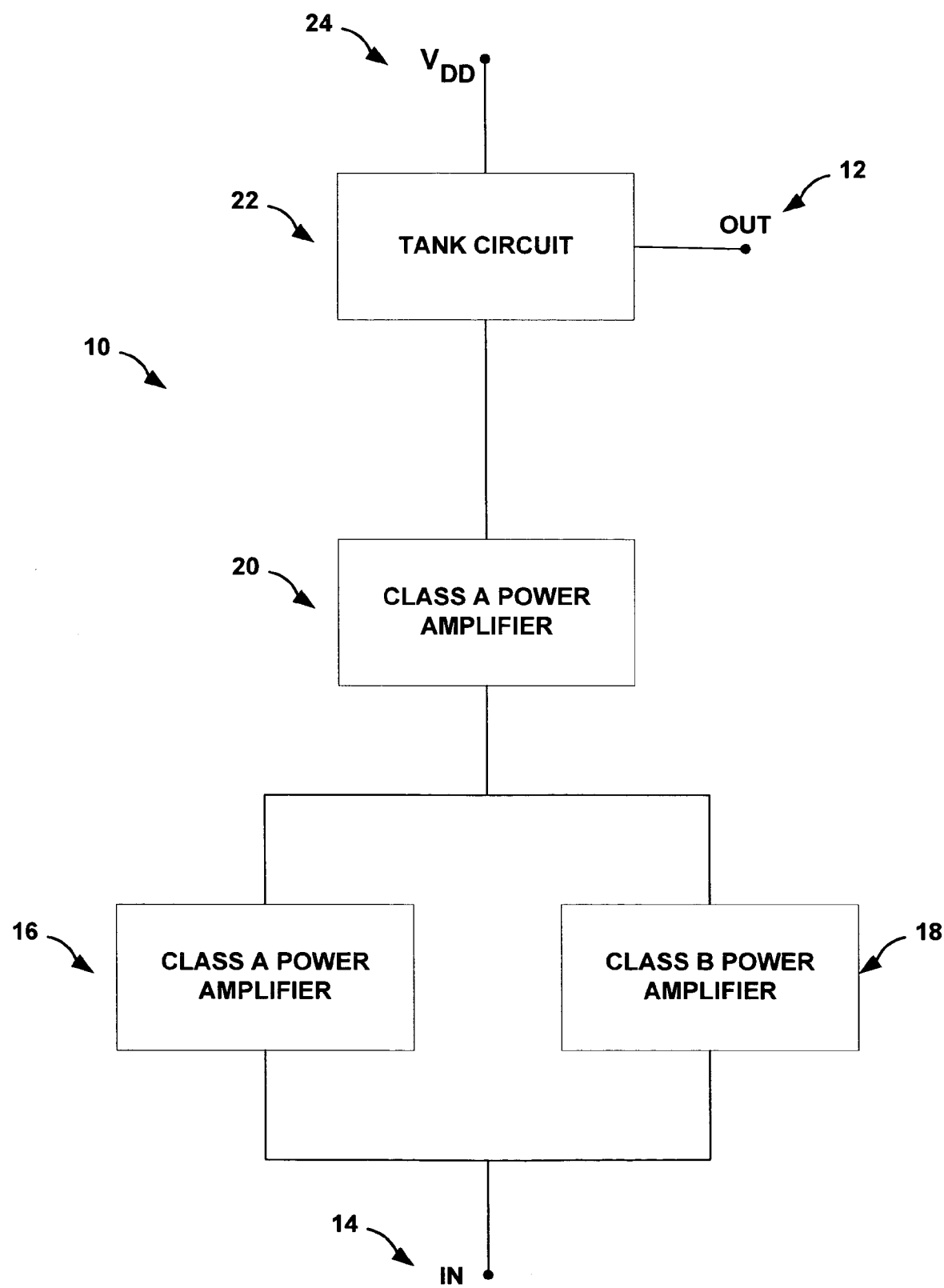
FIG. 1 is a block diagram illustrating an example system for amplification of wireless signals.

FIG. 1 is a block diagram illustrating an example RF power amplifier 10, such as an RF CMOS power amplifier, with enhanced power efficiency and linearity. Amplifier 10 receives an input signal 14 (labeled "IN" in FIG. 1) and generates an amplified output signal 12 (labeled "OUT" in FIG. 1). Amplifier 10 includes three individual power amplifiers 16, 18, 20. Power amplifier 16 is a class A power amplifier. Power amplifier 18 is a class B power amplifier connected in parallel with power amplifier 16 via a common drain node.

A source of a second class A power amplifier 20 is connected to the common drain node of the parallel coupled first class A and class B power amplifiers 16, 18, completing a cascode configuration. The function of the second class A power amplifier 20, connected in the cascode configuration, is to limit nonlinearities due to voltage fluctuations.

An inductor-capacitor (LC) tank circuit 22 provides filtering to limit out-of-band emissions caused by any existing nonlinearities. A DC power supply voltage 24, $V_{DD}$, is fed through tank circuit 22 to the cascode configuration of power amplifiers 16, 18, 20.

Class A and class B amplifiers 16, 18 are arranged in parallel to produce a combined amplifier output for an input signal. As will be described, bias voltages of each of class A amplifier 16 and class B amplifier 18 are set to achieve a desired operating ratio between the class A and class B amplifiers. The bias voltages may be set, for example, such that the power gain is dominated by class A amplifier 16 at small input signal power levels and dominated by class B amplifier 18 at larger input signal power levels.

In this manner, class B amplifier 18 can contribute a higher one decibel compression point (P1 dB point) for the linear portion of the gain curve at larger inputs. In addition, class B amplifier 18 can provide increased power efficiency for larger inputs. Thus, the output of the combined classA/class B amplifier can overcome the trade-off that typically exists between power efficiency and linearity to provide a high power gain over larger input range as well as a higher efficiency.

The combined class A/class B amplifier configuration may be useful in communication systems, such as a wireless communication system. The combined classA/class B amplifier configuration may be especially effective in systems that demand increased dynamic ranges, such as systems that implement orthogonal frequency division multiplexing (OFDM) techniques. Examples of systems that implement OFDM techniques include systems conforming the IEEE 802.11a and 802.11g standards.

Figure 2:
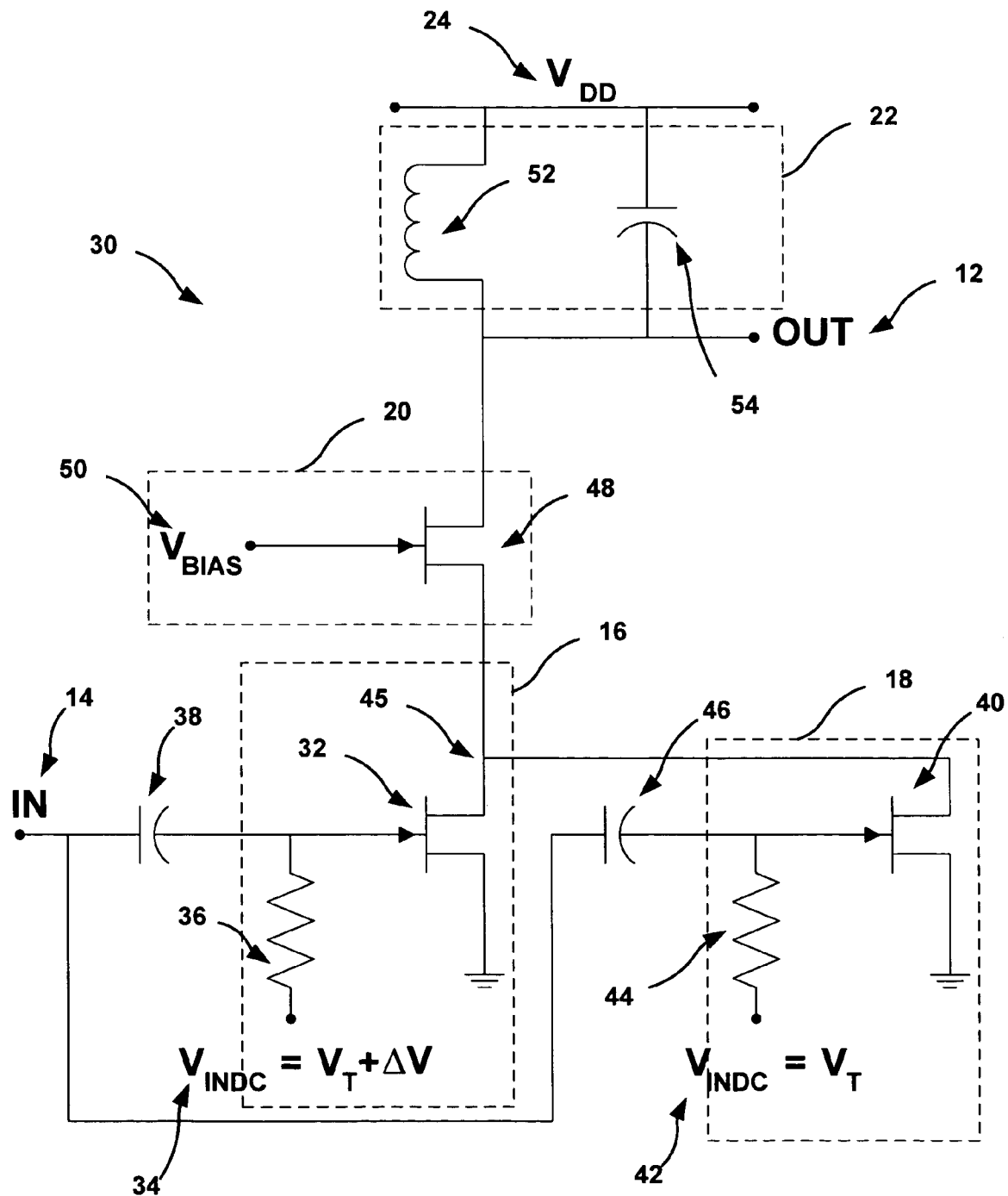
FIG. 2 is a diagram illustrating example circuitry for amplification of wireless signals.

FIG. 2 is a diagram illustrating an example circuit 30 for realizing power amplifier 10 of FIG. 1. Circuit 30 functions as a power amplifier that receives an input signal (labeled "IN" in FIG. 2) and generates an amplified output signal 12 (labeled "OUT" in FIG. 2). As described above, power amplifier 10 includes a first class A power amplifier 16 connected in parallel with a class B power amplifier 18 via a common drain node 45. As such, the class A power amplifier and the class B power amplifier may form an input transconductor cell. A source of a second class A power amplifier 20 is connected to common drain node 45 of the parallel coupled first class A and class B power amplifiers 16, 18, completing a cascode configuration.

Transistor 32, dc input voltage $V_{INDC}$ 34, and resistor 36 form class A power amplifier 16. Supplying $V_{INDC}$ 34 through resistor 36 sufficiently biases transistor 32 to operate in the saturation region and function as a class A power amplifier. $V_{INDC}$ 34 is equal to the sum of the threshold voltage $V_T$ of transistor 32 plus a voltage $\Delta V$ sufficient to bias transistor 32 into the saturation region. Capacitor 38 serves to prevent DC dissipation in resistor 36 and transistor 32.

Class B power amplifier 18 similarly comprises transistor 40, $V_{INDC}$ 42, and resistor 44. $V_{INDC}$ 42 is approximately equal to the threshold voltage $V_T$ of transistor 40 and sufficiently biases transistor 40 to conduct approximately half of each frequency cycle of input signal 14 and thereby function as a class B power amplifier. Capacitor 46 serves to prevent DC dissipation in resistor 44 and transistor 40. Transistors 32, 40 may, for example, comprise metal oxide silicon field effect transistors (MOSFETs).

Common drain node 45 of power amplifiers 16 and 18 is connected to the source of class A power amplifier 20, which comprises transistor 48 and $V_{BIAS}$ 50. $V_{BIAS}$ 50 is sufficient to keep the transistor in the saturation region of operation. Connecting the drain of transistor 48 to the parallel connection of inductor 52 and capacitor 54, which form LC tank circuit 22, allows the capacitance of transistors 32, 40, and 48 to be absorbed into the tank circuit 22. The resulting advantage is that the LC tank compresses the out-of-band signals.

In operation, the bias voltages of each of class A amplifier 16 and class B amplifier 18 are set, as described above, to achieve a desired operating ratio between the class A and class B amplifiers. In particular, $V_{INDC}$ 34 is set to bias transistor 32 into the saturation region such that the power gain of class A amplifier 16 dominates at small input powers. $V_{INDC}$ 42 is set to bias transistor 40 to bias transistor 40 such that the power gain of class B amplifier 18 dominates at larger input powers. In other words, class B amplifier 18 contributes a higher P1 dB point for the linear portion of the gain curve at larger inputs. Furthermore, class B amplifier 18 can provide increased power efficiency for larger inputs. In this manner, the combined class A/class B amplifier provides an enhanced power efficiency and linearity.

Figure 3:
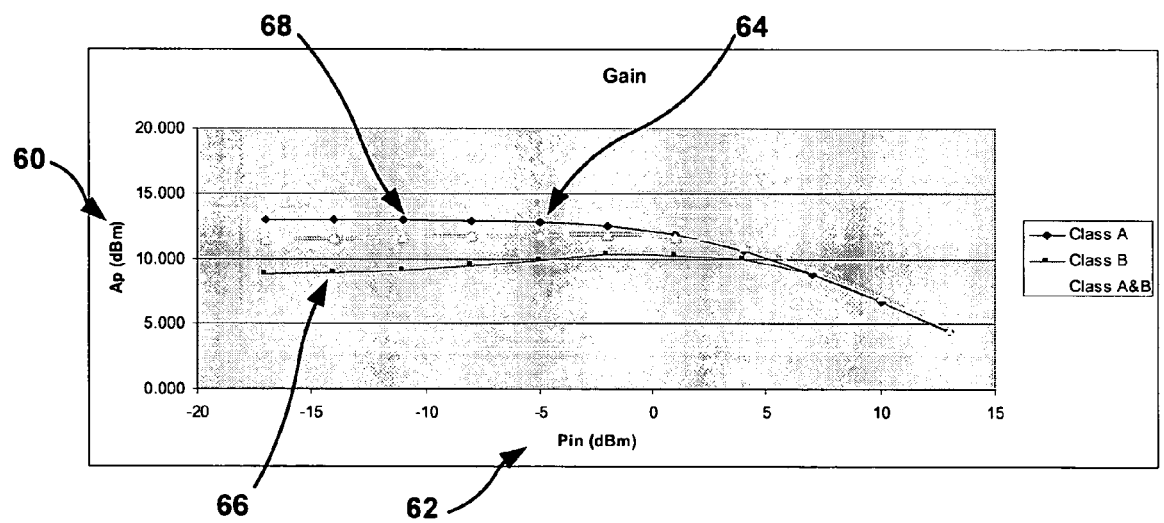
FIG. 3 is a graph illustrating exemplary power gain curves for a range of input signals.

FIG. 3 is a graph illustrating exemplary power gain curves for class A and B power amplifiers as well as for a combined class A/class B amplifier in accordance with an embodiment of the invention. The graph plots output power (dBm) along the vertical axis 60 and input power (dBm) along the horizontal axis 62. Curve 64 indicates that a class A amplifier power gain is highly linear at low input power but low and nonlinear at high power inputs. A power gain curve 66 indicates that a class B amplifier power gain is nonlinear at lower input power. In addition, gain curve 64 of the class A amplifier reaches its 1P dB point at a lower frequency than gain curve 66 associated with the class B amplifier.

Gain curve 68 for a combined class A/class B amplifier in accordance with the invention illustrates the advantages of combining both class A and class B amplifiers to produce a combined amplifier output. In particular, gain curve 68 indicates an overall gain that is linear over a larger range of input power values and has a 1P dB point at a higher frequency than the class A amplifier.

Figure 4:
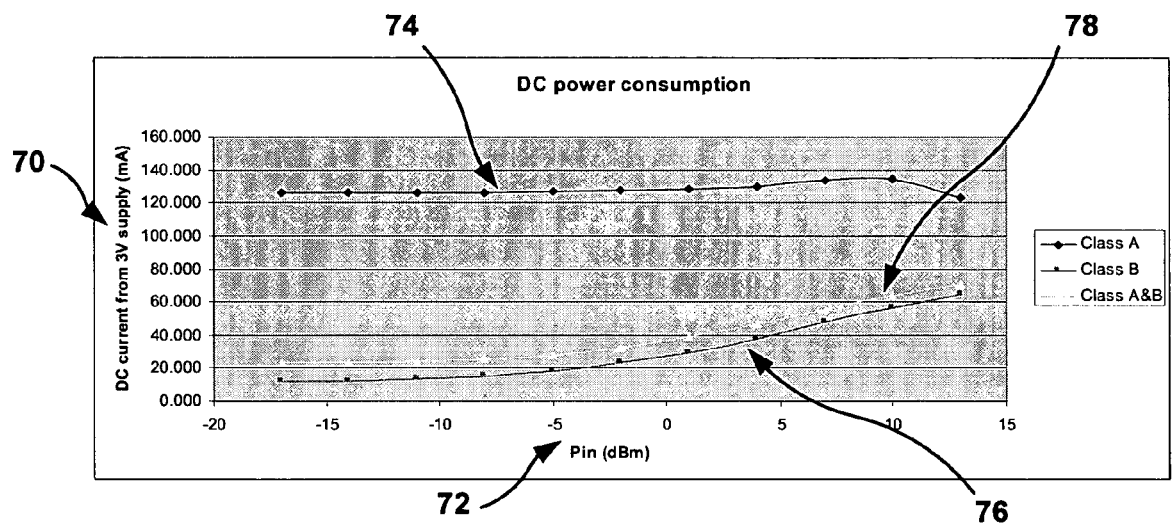
FIG. 4 is a graph illustrating exemplary DC power consumption curves for a range of input signals.

FIG. 4 is a graph illustrating exemplary DC power consumption curves for class A and B power amplifiers as well as for a combined class A/class B amplifier in accordance with the invention. DC power is required to maintain the bias of power amplifiers, but large DC power consumption lowers the power added efficiency (PAE), especially at low power inputs. The graph of FIG. 4 plots DC current from a three volt supply (mA) along the vertical axis 70 and input power (dBm) along the horizontal axis 72. Curve 74 illustrates, for a class A amplifier, the high DC power consumption curve resulting from the high bias voltage needed to keep the class A power amplifier operating in the region of saturation.

DC power consumption curve 76, for a class B amplifier, is relatively low because the power amplifier need only be biased at the threshold voltage. The DC power consumption curve 78 for a combined class A/class B amplifier in accordance with the invention is relatively low because the class B power amplifier does not require much current to stay sufficiently biased. At low power inputs, the class A power amplifier in parallel with the class B power amplifier compensates the gain depression of the class B power amplifier. Consequently, the size of the class A power amplifier can be made much smaller than that of the class B power amplifier. The much smaller size of the class A power amplifier in the parallel class A/class B connection results in much less DC power consumption by the class A power amplifier.

Figure 5:
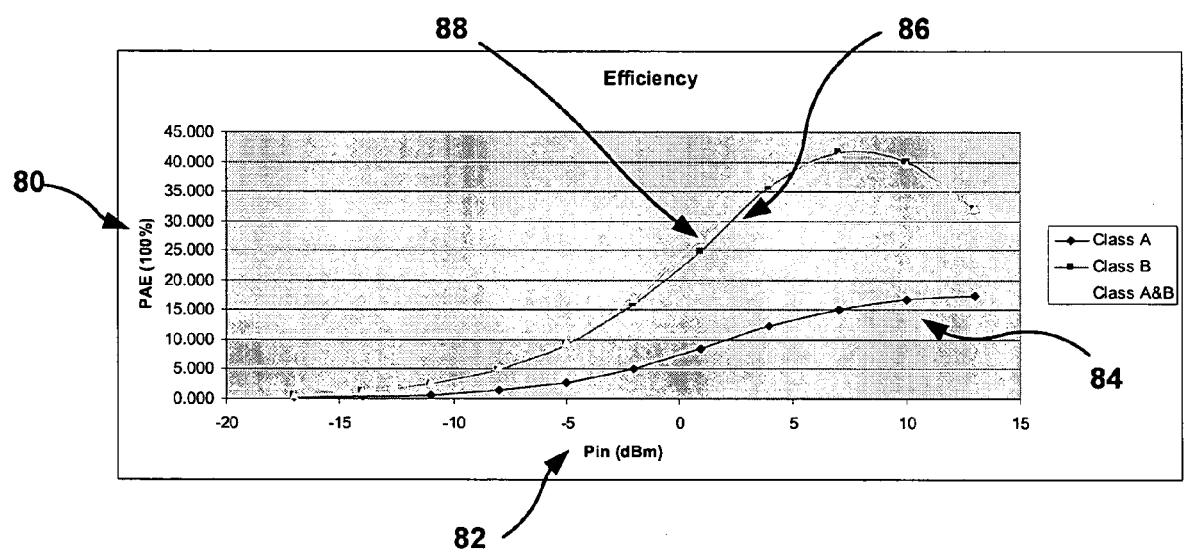
FIG. 5 is a graph illustrating exemplary power added efficiency curves for a range of input signals.

FIG. 5 is a graph illustrating exemplary efficiency curves for class A and B power amplifiers as well as for a combined class A/class B amplifier. The graph plots power added efficiency (PAE) (%) along the vertical axis 80 and input power (dBm) along the horizontal axis 82. Curve 84 illustrates the low PAE of a class A amplifier caused by large DC power consumption. The maximum theoretical PAE of a class A power amplifier is 50%. However, it is difficult to achieve more than 30% PAE with a class A amplifier in practice. Class B amplifiers have a theoretical PAE of 78.5% but typically achieve below 40% in practice. The PAE for a class B amplifier approaches zero at low input power because there is a minimum DC voltage required to maintain the bias at the threshold voltage, and the class B power amplifier is working in a weak inversion stage.

Increasing the input power results in the class B power amplifier working in saturation at most of each half cycle, resulting in a higher gain and efficiency. The efficiency curve 88 for a combined class A/class B power amplifier in accordance with the invention is very similar to the class B power amplifier curve 86. At low power inputs, the gain and DC power consumption is dominated by the first class A power amplifier. The class B power amplifier of the combined class A/class B amplifier does not need much current to stay sufficiently biased, however, especially at low power inputs. The parallel coupled class A power amplifier functions to compensate the gain depression of the class B power amplifier. Consequently, the size of the class A power amplifier coupled to the class B power amplifier can be much smaller and consume less DC power.

Figure 6:
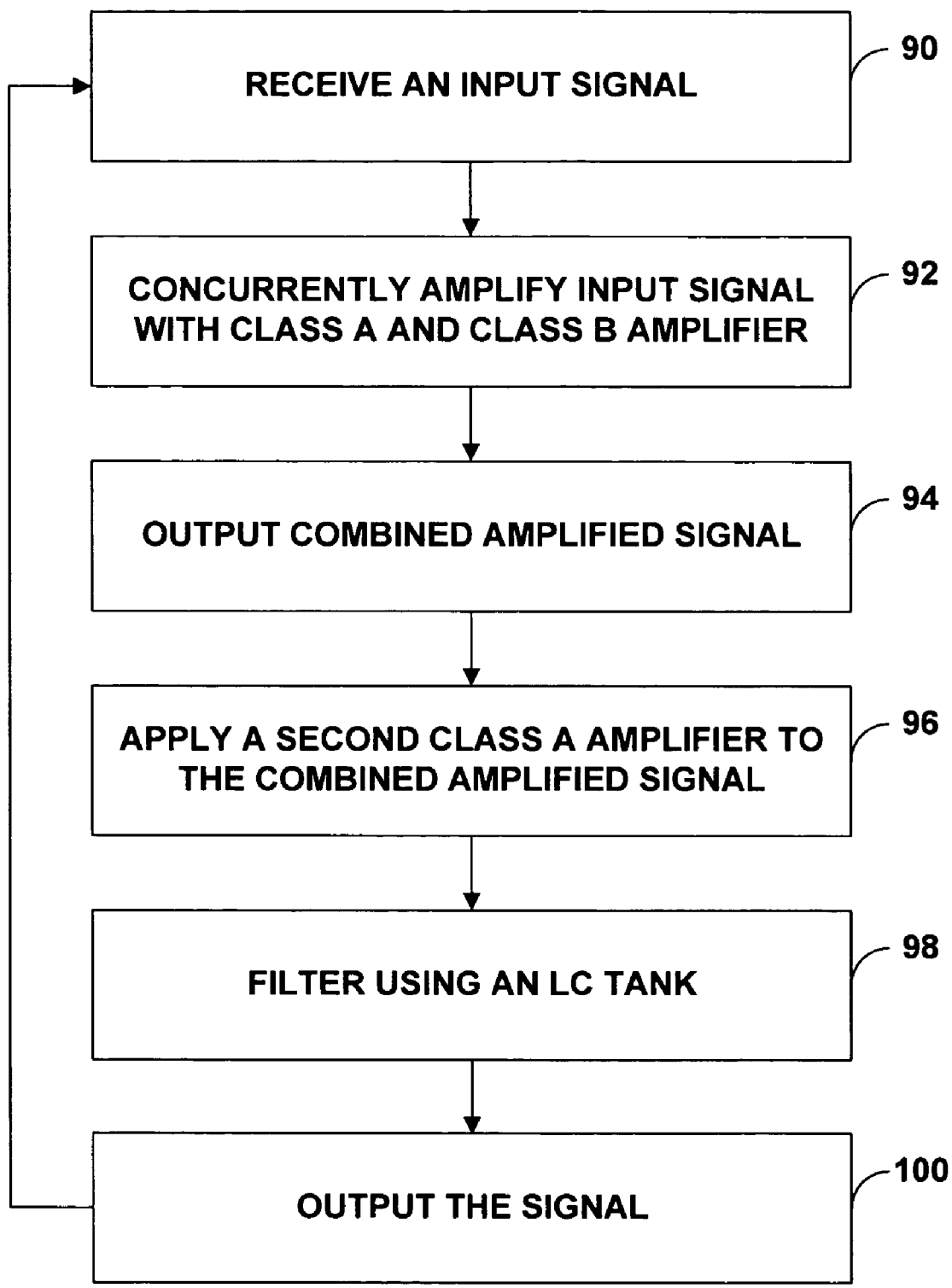
FIG. 6 is a flow diagram illustrating exemplary operation of an RF power amplifier that includes a combined class A/class B power amplifier.

FIG. 6 is a flow diagram illustrating exemplary operation of an RF power amplifier, such as a RF power amplifier 10 of FIG. 1, that includes a combined class A/class B power amplifier. As described in detail above, the combined class A/class B amplifier has enhanced power efficiency and linearity characteristics. Initially, RF power amplifier 10 receives an input signal (90). RF power amplifier 10 may, for example receive an input signal to be transmitted from a wireless device.

A class A power amplifier 16 and a class B power amplifier 18 concurrently amplify the input signal (92) and the combined amplified signal is output to a second class A amplifier 20 (94). As described in detail above, the bias voltages of each of class A amplifier 16 and class B amplifier 18 are set to achieve a desired operating ratio between the class A and class B amplifiers to provide a high power gain over larger input range as well as a higher efficiency.

Specifically, the bias voltages may be set such that the power gain of the combined class A/class B amplifier is dominated by class A amplifier 16 at small input powers and dominated by class B amplifier 18 at larger input powers. In other words, class B amplifier 18 can contribute a higher one decibel compression point (P1 dB point) for the linear portion of the gain curve at larger inputs. In addition, class B amplifier 18 can provide increased power efficiency for larger inputs.

A second class A power amplifier 20 amplifies the combined signal output from the combined class A/class B amplifier (96). The second class A power amplifier 20 may, for example, be connected to a common drain node of the parallel coupled first class A and class B power amplifiers 16, 18. The amplification of the combined signal output from the parallel coupled class A and class B amplifiers 16, 18 limits nonlinearities due to voltage fluctuations.

An inductor-capacitor (LC) tank circuit 22 provides filtering to the signal output from the second class A power amplifier 20 to limit out-of-band emissions caused by any existing nonlinearities (98) and then the signal is output from RF power amplifier 10 (100).

Figure 7:
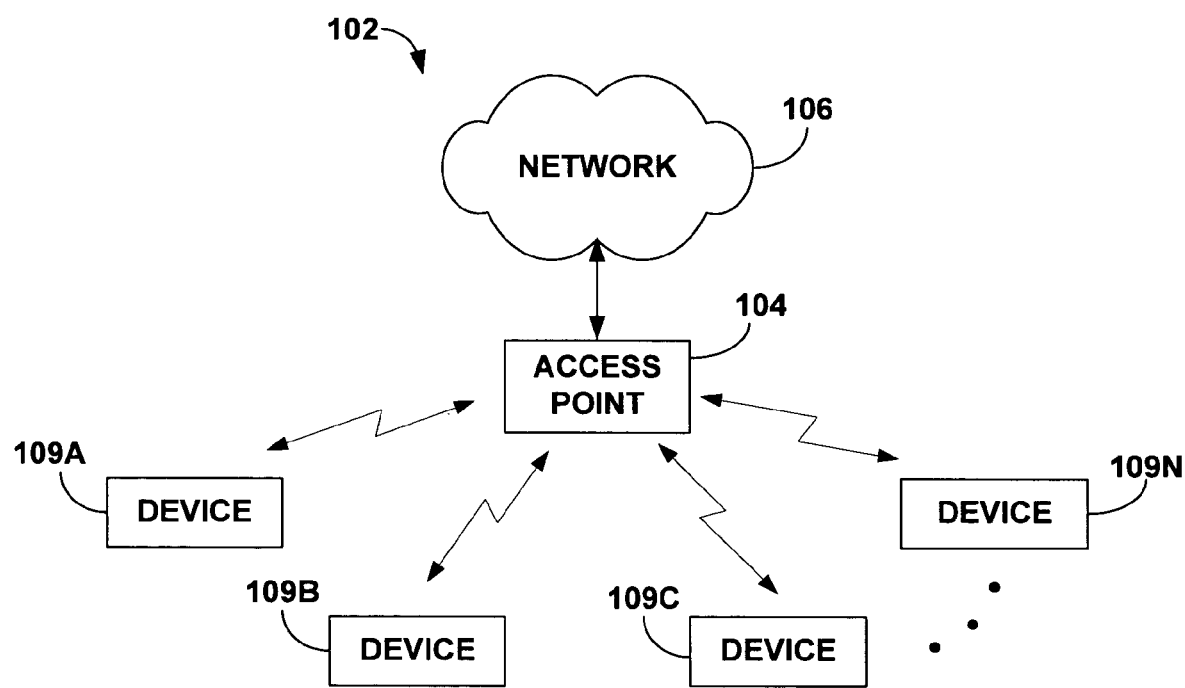
FIG. 7 is a block diagram illustrating one exemplary embodiment of a wireless communication network within which the amplification techniques of the invention may be implemented.

FIG. 7 is a block diagram illustrating one exemplary embodiment of a wireless communication network 102 within which the amplification techniques described above may be implemented. Although the amplification techniques described herein may be applicable to devices useful with a wide array of computing devices, the techniques will be described in the context of a wireless communication network 102 for purposes of illustration.

As shown in FIG. 7, wireless communication network 102 may include at least one wireless access point 104 coupled to a wired network 106. Wireless access point 104 permits wireless communication between wired network 106 and one or more wireless computing devices 109A–109N (collectively "wireless computing devices 109"). Wireless access point 104 and wireless computing devices 109 may communicate according to one or more Wireless Local Area Network (WLAN) protocols such as those specified by the IEEE 802.11a, 802.11b, 802.11e or 802.11g standards. Wireless communication network 102 will be generally described herein in the context of the IEEE 802.11 standards for purposes of illustration.

Wireless access point 104 may integrate a hub, switch or router to serve multiple devices 109. Wireless communication network 102 may be used to communicate data, voice, video and the like between devices 109 and wired network 106 according to a variety of different wireless transmission formats, such as Orthogonal Frequency Division Multiplexing (OFDM). Network 106 may be a local area network (LAN), wide area network (WAN) or global network such as the Internet.

Wireless computing devices 109 may take a variety of forms including desktop computers, portable computers, personal digital assistants (PDAs), wireless telephones, multimedia devices, consumer electronics and the like. Each device 109 is equipped with hardware to provide attachment to wireless communication network 102. For example, a wireless communication device 109 may include a peripheral device, such as a wireless network card or board coupled to a host computer via an external or internal interface, including Peripheral Component Interconnect (PCI), Mini PCI, Universal Serial Bus (USB), USB-102, Cardbus, IEEE 13109104, or Personal Computer Memory Card International Association (PCMCIA) interfaces.

In general, one or more of wireless computing devices 109 implement techniques for amplification with enhanced power efficiency and linearity in accordance with the invention. In particular, an RF power amplifier within wireless computing devices 109 includes a class A and class B amplifier connected in parallel to produce a combined amplifier output for an input signal. As described in detail above, bias voltages of each of the class A amplifier and the class B amplifier are set to achieve a desired operating ratio between the class A and class B amplifiers. Particularly, the bias voltage is set such that the power gain of the combined class A/class B amplifier is dominated by the class A amplifier at small input powers and dominated by the class B amplifier at larger input powers. Furthermore, the class B amplifier provides increased power efficiency at larger inputs.

Figure 8:
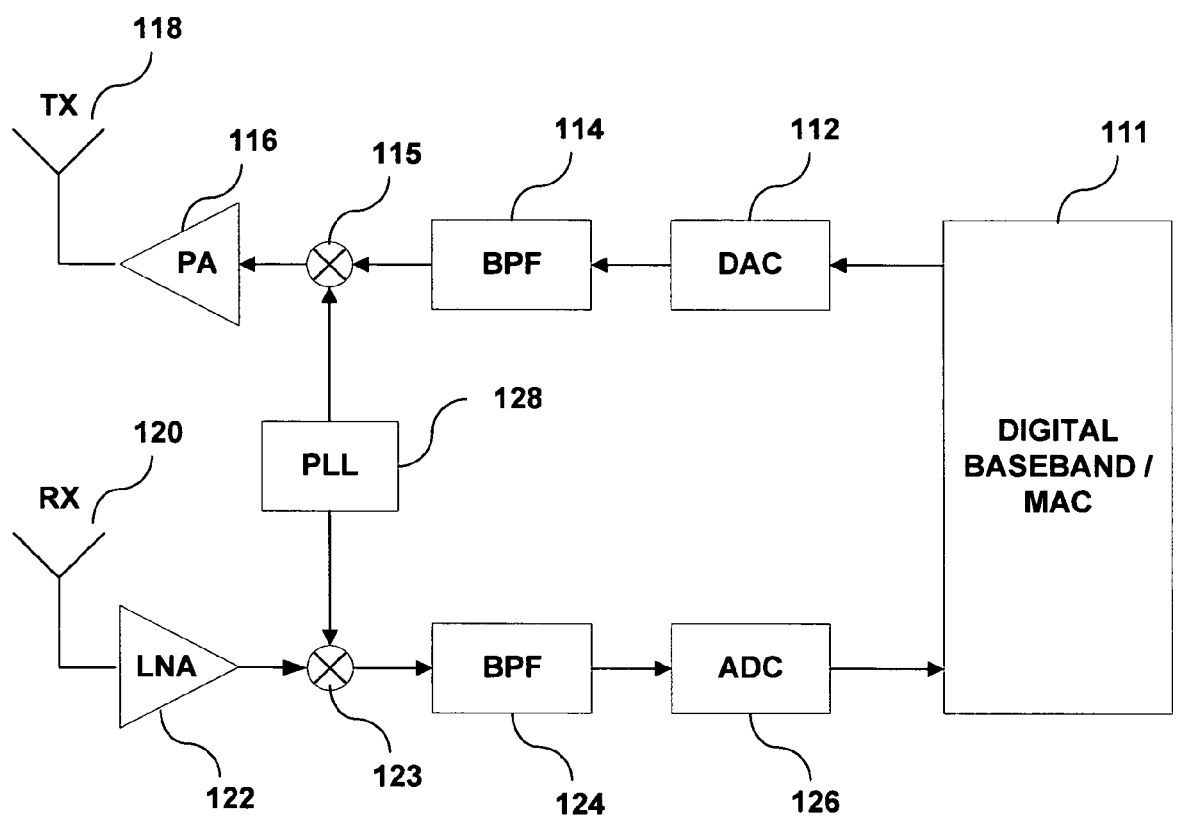
FIG. 8 is a block diagram illustrating a wireless communication device for implementing the techniques of the invention.

FIG. 8 is a block diagram illustrating a wireless communication device 109 in further detail. As shown in FIG. 8, device 109 includes a digital baseband/medium access control (MAC) unit 111, a digital to analog converter (DAC) 112, a bandpass filter (BPF) 114, a mixer 115, a transmitter amplifier (PA) 116, a transmit (TX) antenna 118, a receive (RX) antenna 120, a receiver amplifier (LNA) 122, a mixer 123, a bandpass filter (BPF) 124, an analog-to-digital converter (ADC) 126, and a phase-locked loop (PLL) 128. Device 110 is equipped to both transmit and receive signals, coordinated by digital baseband/MAC unit 111, which utilizes protocols, such as the protocol specified by the IEEE 802.11 standards described above, to enhance communication over a wireless medium.

A digital baseband signal is generated by a host device (not shown), such as a computing device, a personal digital assistant (PDA), a mobile telephone, or the like, utilizing wireless communication device 110. Digital baseband/MAC unit 111 interacts with the host device to coordinate access to an RF channel for the signal. DAC 112 converts the digital baseband signal to an analog baseband signal. The analog baseband signal may then be upconverted and modulated to enable signal propagation at the channel frequency.

As an example, the signal may have a baseband frequency of 10 MHz with a bandwidth of 20 MHz. A wireless communication system operating according to an IEEE 802.11a standard requires an orthogonal frequency division multiplexing (OFDM) modulation technique to transmit signals at a 5 GHz band. BPF 114 prepares the signal for transmission by filtering the signal at the given bandwidth. Mixer 115 combines the filtered signal from BPF 114 with an output of PLL 128, and upconverts the signal to radio frequency. The RF signal is amplified by PA 116 and transmitted by TX antenna 118.

The receiver portion of wireless communication device 110 works much the same as the transmitter portion, only in reverse. A transmitted signal is received by RX antenna 120 and amplified by LNA 122. BPF 124 uses the same bandwidth as BPF 114 in the transmit sequence and separates the desired signal from other signals in the frequency band. PLL 128 output is combined with BPF 124 output in mixer 123 to determine the phase of the received signal. The recovered signal is demodulated to the baseband frequency by, for example, an OFDM demodulation technique. ADC 126 converts the baseband analog signal into a baseband digital signal to enable interaction with the host device via digital baseband/MAC unit 111.

In accordance with the invention, either PA 116 or LNA 122 or both may comprise a class A power amplifier coupled in parallel to a class B amplifier to overcome the trade-off that exists between power efficiency and linearity to provide a high power gain over larger input range as well as a higher efficiency.

Various embodiments of the invention have been described. These and other embodiments are within the scope of the following claims.

The invention claimed is:

1. A radio frequency (RF) amplifier circuit comprising:
   a class A power amplifier;
   a class B power amplifier coupled to the class A power amplifier such that the class A and class B RF power amplifiers produce a combined amplifier output for an RF input signal; and
   a tank circuit coupled to the class A and class B power amplifiers.

2. The amplifier circuit of claim 1, wherein the class A and class B power amplifiers are coupled in parallel to form an input transconductor cell.

3. The amplifier circuit of claim 1, wherein the class A power amplifier is biased to operate in a saturation region and the class B power amplifier is biased to amplify approximately half of every cycle of the input signal.

4. The amplifier circuit of claim 1, wherein the class A power amplifier compensates gain depression of the class B power amplifier at low power inputs.

5. The amplifier circuit of claim 1, wherein a size of a first transistor associated with the class A power amplifier is substantially smaller than a size of a second transistor associated with the class B power amplifier.

6. The amplifier circuit of claim 1, wherein the class A power amplifier includes a first transistor and the class B power amplifier includes a second transistor, the first and second transistors being coupled via a common drain node.

7. The amplifier circuit of claim 6, wherein the first and second transistors comprise MOSFETS.

8. The amplifier circuit of claim 6, wherein the class A power amplifier is a first class A power amplifier, the circuit further comprising a second class A power amplifier having a source coupled to the common drain node of the first class A power amplifier and the class B power amplifier, wherein the tank circuit is coupled to the first class A power amplifier and the class B power amplifier via the second class A power amplifier.

9. The amplifier circuit of claim 8, wherein the tank circuit includes an inductor and capacitor coupled in parallel to a drain of the second class A power amplifier.

10. The amplifier circuit of claim 1, wherein the class A power amplifier is biased such that a bias voltage of the class A power amplifier is greater than a threshold voltage of the class A power amplifier.

11. The amplifier circuit of claim 1, wherein the class B power amplifier is biased at approximately a threshold voltage of the class B power amplifier.

12. The amplifier circuit of claim 1, wherein the class A and class B amplifiers comprise CMOS amplifiers.

13. A method comprising amplifying an input radio frequency (RF) signal with combined outputs of a class A power amplifier and a class B power amplifier and applying the combined outputs to a tank circuit coupled to the class A and class B power amplifiers.

14. The method of claim 13, further comprising:
biasing the class A power amplifier to operate in a saturation region; and
biasing the class B power amplifier to amplify approximately half of every cycle of the input signal.

15. The method of claim 14, wherein biasing the class A power amplifier to operate in a saturation region comprises biasing the class A power amplifier with a bias voltage that is greater than a threshold voltage of the class A amplifier.

16. The method of claim 14, wherein biasing the class B power amplifier to amplify approximately half of every cycle of the input signal comprises biasing the class B power amplifier with a bias voltage that is at approximately a threshold voltage of the class B power amplifier.

17. The method of claim 13, wherein the class A power amplifier is a first class A power amplifier, and further comprising amplifying the combined outputs of the first class A power amplifier and the class B power amplifier with a second class A power amplifier.

18. The method of claim 17, wherein the second class A power amplifier is connected to a common drain node of the parallel coupled first class A and class B power amplifiers.

19. The method of claim 17, wherein the tank circuit includes an inductor and a capacitor coupled in parallel, the method further comprising a filtering the output of the second class A amplifier with the tank circuit.

20. A wireless device comprising:
a medium access control (MAC) unit that interacts with a host device to coordinate access to a radio frequency (RF) channel for an input signal generated by the host device;
an RF transmit power amplifier circuit to amplify the input signal, the RF transmit power amplifier circuit comprising a class A power amplifier and a class B power amplifier coupled to the class A power amplifier such that the class A and class B power amplifiers produce a RF combined amplifier output signal for the input signal a tank circuit coupled to the class A and class B power amplifiers; and
a transmit antenna to transmit the RF amplifier output signal to a wireless network.

21. The wireless device of claim 20, wherein the class A and class B power amplifiers are coupled in parallel to form an input transconductor cell.

22. The wireless device of claim 20, wherein the class A power amplifier is biased to operate in a saturation region and the class B power amplifier is biased to amplify approximately half of every cycle of the input signal.

23. The wireless device of claim 20, wherein the class A power amplifier compensates gain depression of the class B power amplifier at low power inputs.

24. The wireless device of claim 20, wherein a size of a first transistor associated with the class A power amplifier is substantially smaller than a size of a second transistor associated with the class B power amplifier.

25. The wireless device of claim 20, wherein the class A power amplifier includes a first transistor and the class B power amplifier includes a second transistor, the first and second transistors being coupled via a common drain node.

26. The wireless device of claim 25, wherein the first and second transistors comprise MOSFETS.

27. The wireless device of claim 25, wherein the class A power amplifier is a first class A power amplifier, the circuit further comprising a second class A power amplifier having a source coupled to the common drain node of the first class A power amplifier and the class B power amplifier.

28. The wireless device of claim 27, further comprising a tank circuit including an inductor and capacitor coupled in parallel to a drain of the second class A power amplifier.

29. The wireless device of claim 20, wherein the class A power amplifier is biased such that a bias voltage of the class A power amplifier is greater than a threshold voltage of the class A power amplifier.

30. The wireless device of claim 20, wherein the class B power amplifier is biased at approximately a threshold voltage of the class B power amplifier.

31. The wireless device of claim 20, further comprising:
a receiver to receive a wireless signal from a wireless network; and
a receive power amplifier circuit to amplify a received signal, the receive power amplifier circuit comprising a class A power amplifier and a class B power amplifier coupled to the class A power amplifier such that the class A and class B power amplifiers produce a combined amplifier output for an input signal.

32. The wireless device of claim 31, wherein the class A power amplifier includes a first transistor and the class B power amplifier includes a second transistor, the first and second transistors being coupled via a common drain node.

33. The wireless device of claim 32, wherein the class A power amplifier of the receive power amplifier circuit is a first class A power amplifier, the circuit further comprising a second class A power amplifier having a source coupled to the common drain node of the first class A power amplifier and the class B power amplifier.

34. The wireless device of claim 33, wherein the a tank circuit includes an inductor and capacitor coupled in parallel to a drain of the second class A power amplifier.

* * * * *

UNITED STATES PATENT AND TRADEMARK OFFICE
CERTIFICATE OF CORRECTION

| | | |
|---|---|---|
| PATENT NO. | : 7,205,846 B1 | Page 1 of 1 |
| APPLICATION NO. | : 10/918745 | |
| DATED | : April 17, 2007 | |
| INVENTOR(S) | : Ding et al. | |

It is certified that error appears in the above-identified patent and that said Letters Patent is hereby corrected as shown below:

On column 9, Claim 20, lines 52-55 should read

-- input signal;

a tank circuit coupled to the class A and class B power amplifiers; and a transmit antenna to transmit the RF amplifier output signal to a wireless network.--

On column 10, Claim 34, line 54, delete "a" before the word "tank".

Signed and Sealed this

Eleventh Day of December, 2007

JON W. DUDAS
*Director of the United States Patent and Trademark Office*